(12) United States Patent
Creeden et al.

(10) Patent No.: US 8,824,513 B2
(45) Date of Patent: Sep. 2, 2014

(54) METHOD FOR BEAM COMBINATION BY SEEDING STIMULATED BRILLOUIN SCATTERING IN OPTICAL FIBER

(75) Inventors: Daniel J. Creeden, Nashua, NH (US);
York E. Young, Amherst, NH (US);
Kenneth Dinndorf, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/818,006

(22) PCT Filed: Jun. 6, 2012

(86) PCT No.: PCT/US2012/041011
§ 371 (c)(1),
(2), (4) Date: Feb. 20, 2013

(87) PCT Pub. No.: WO2012/173839
PCT Pub. Date: Dec. 20, 2012

(65) Prior Publication Data
US 2013/0148673 A1 Jun. 13, 2013

Related U.S. Application Data

(60) Provisional application No. 61/496,727, filed on Jun. 14, 2011.

(51) Int. Cl.
*H01S 3/30* (2006.01)
*H01S 3/10* (2006.01)
*H01S 3/094* (2006.01)
*H01S 5/40* (2006.01)
*H01S 3/16* (2006.01)
*H01S 3/067* (2006.01)

(52) U.S. Cl.
CPC ............. *H01S 3/302* (2013.01); *H01S 3/10084* (2013.01); *H01S 3/09408* (2013.01); *H01S 5/4012* (2013.01); *H01S 3/1618* (2013.01); *H01S 3/094007* (2013.01); *H01S 3/06754* (2013.01); *H01S 3/06729* (2013.01)
USPC ............................................................. 372/6

(58) Field of Classification Search
USPC ............................................................ 372/6
See application file for complete search history.

(56) References Cited

U.S. PATENT DOCUMENTS 5,515,192 A  5/1996  Watanabe
6,122,097 A  9/2000  Weston et al.
(Continued)

OTHER PUBLICATIONS

Brown, Kirk, et al., Passive combination of multiple beams in an optical fiber via stimulated Brillouin scattering, Optics Letters, May 1, 2007, vol. 323, No. 9, 2007 Optical Society of America, pp. 1047-1049.

(Continued)

*Primary Examiner* — Kinam Park
(74) *Attorney, Agent, or Firm* — Daniel J. Long

(57) ABSTRACT

A system and method for efficiently combining multiple laser beams into a single frequency by invoking stimulated Brillouin scattering (SBS) in a dual core optical fiber is disclosed. The method and apparatus essentially becomes a brightness converter for the input laser beams. An SRS seed is generated in a long length of fiber or by a diode and is launched into the back-end of the SBS combining optical fiber. Various single-frequency pump beams are launched into the front-end of the same fiber. The seed acts to lower a threshold for SBS in the fiber, thus invoking the nonlinearity. Provided the various pump beams are close in frequency and seed/pump modes overlap, each acts to amplify the seed through the nonlinear SBS process, providing an output signal which is brighter than the combined pump beams.

20 Claims, 5 Drawing Sheets

(56) References Cited

U.S. PATENT DOCUMENTS

| | | |
|---|---|---|
| 6,178,036 B1 | 1/2001 | Yao |
| 6,417,957 B1 | 7/2002 | Yao |
| 6,965,469 B2 | 11/2005 | Avizonis et al. |
| 7,321,710 B2 | 1/2008 | Clarkson et al. |
| 7,751,118 B1 * | 7/2010 | Di Teodoro et al. ........ 359/333 |
| 2004/0095968 A1 * | 5/2004 | Avizonis et al. ............ 372/6 |
| 2006/0165336 A1 | 7/2006 | Mangir et al. |
| 2007/0127123 A1 * | 6/2007 | Brown et al. ............... 359/556 |
| 2008/0198880 A1 * | 8/2008 | Munroe et al. ............. 372/6 |
| 2009/0010288 A1 | 1/2009 | Keaton et al. |

OTHER PUBLICATIONS

PCT/US2012/041011 ISR mailed Sep. 24, 2012.

* cited by examiner

METHOD FOR BEAM COMBINATION BY SEEDING STIMULATED BRILLOUIN SCATTERING IN OPTICAL FIBER

CROSS-REFERENCE TO RELATED APPLICATIONS

This Application claims rights under 35 USC §119(e) from U.S. Application Ser. No. 61/496,727 filed Jun. 14, 2011, the contents of which are incorporated herein by reference.

TECHNICAL FIELD

Embodiments are generally related to lasers. Embodiments are also related to a method of incoherently combining a plurality of laser beams in a single dual core optical fiber Embodiments are additionally related to an apparatus and method of combining a plurality of laser beams into bright single frequency beam by utilizing Stimulated Brillouin Scattering (SBS) seed beam.

BACKGROUND OF THE INVENTION

A laser is a device that emits light (electromagnetic radiation) through a process of optical amplification based on the stimulated emission of photons. A fiber laser is a laser in which the active gain medium is an optical fiber doped with rare-earth elements. They are related to doped fiber amplifiers, which provide light amplification without lasing. Fiber nonlinearities, such as Stimulated Brillouin Scattering (SBS), stimulated Raman scattering or four-wave mixing can also provide gain and thus serve as gain media for a fiber laser.

Recent advances in fiber lasers have made them a leading candidate for various applications. To achieve required power levels needed for certain laser applications it may be necessary to combine a large number of lasers for efficient propagation over distances of many kilometers. Fiber lasers can be combined spectrally, coherently, or incoherently.

For intense laser beams travelling in a medium such as an optical fiber, the variations in the electric field of the beam may produce acoustic vibrations in the medium via electrostriction. The beam may undergo Brillouin scattering from these vibrations, usually on opposite direction to the incoming beam, a phenomenon known as Stimulated Brillouin Scattering (SBS). Stimulated Brillouin scattering is one effect by which optical phase conjugation can take place.

For the past few decades, stimulated Brillouin scattering (SBS) in optical fibers has been vigorously investigated in optical fibers. SBS has been used successfully in the past to combine and clean up an aberrated beam Research conducted in the last few years have been successful in combining two beams from mutually incoherent sources. Recently it has been demonstrated that the output from two fiber amplifiers can be successfully phased and combined using SBS. The task remains to efficiently combine more than two beams.

In the prior art various means have been suggested to combine multiple laser beams into a single frequency. One such method is to use unseeded Stimulated Brillouin Scattering (SBS) combination in a multi rode GRIN fiber. Such method utilizes a single core GRIN fiber and unseeded beam for combining incoherent beams from district and non-phase controlled diode lasers. Disadvantage of such method is low conversion efficiency due to poor SMS signal/pump signal overlap and high SBS threshold in the large nonlinear fiber.

A need, therefore, exists for an improved way to incoherently combine multiple pump lasers in a single optical fiber. There is also a need for a high efficient, scalable, high brightness laser source. In addition, improving the signal/pump overlap area greatly improves conversion efficiency.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for laser systems.

It is another aspect of the disclosed embodiments to provide for a method of incoherently combining a plurality of laser beams in a single dual core optical fiber.

It is yet another aspect of the disclosed embodiments to provide for an apparatus and method of combining a plurality of laser beams into a bright single frequency beam by utilizing a Stimulated Brillouin Scattering (SBS) seed beam.

It is a further aspect of the present invention to provide for an apparatus and method of enhancing brightness of incoherently combined pump lasers.

It is another aspect of the present invention to provide for a dual core optical fiber utilizing seed beam and SBS process for combining plurality of laser beams into a single frequency beam.

It is a yet another aspect of the present invention is to focus various pump laser beams into one end of a pedestal of a dual core fiber and seed beam into other end of the fiber, in order to amplify the seed beam to provide an output signal brighter than combined pump beams.

The aforementioned aspects and other objectives and advantages can now be achieved as described herein. According to the present invention by invoking stimulated Brillouin scattering (SBS) in a novel optical fiber, multiple laser beams can be efficiently combined into a single frequency. The method and apparatus essentially becomes a brightness converter for the input laser beams. An SBS seed is generated in a long length of fiber or by a diode and is launched into the back-end of the SBS combining optical fiber. Various single-frequency pump beams are launched into the front-end of the same fiber. The seed acts to lower a threshold for SBS in the fiber, thus invoking the nonlinearity. Provided the various pump beams are close in frequency and seed/pump modes overlap, each acts to amplify the seed through the nonlinear SBS process, providing an output signal which is brighter than the combined pump beams.

SBS provides the underlying physical mechanism by which incoherent beams from district and non-phase controlled diode lasers are combined and brightness enhanced. By seeding the process, the SBS mechanism can be used as amplifier for the input beam, deriving several advantages relative to unseeded SBS beam combination. The seeding process provides various advantages such as increases combination efficiency, the fiber lengths can be kept short, prevents competition from efficiency-robbing competitive nonlinear processes and amplifiers can be "staged" using conventional components (the required fiber lengths become shorter as power levels increase. Also the temporal output amplified beam is controlled by the input beam and thus modulated output can be created. The present invention provides excellent spatial overlap of the pump-induced acoustic Brillouin waves and very high (>90%) intrinsic extraction efficiency compared to an unseeded SBS process.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
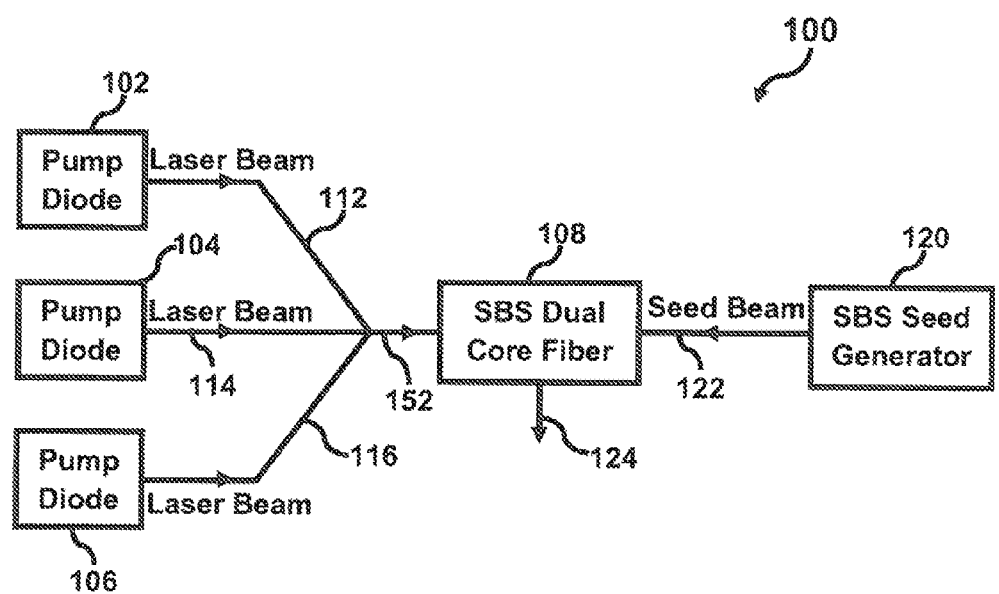
FIG. 1 illustrates a simplified block diagram of an apparatus for combining plurality of laser beams in a single dual core optical fiber, in accordance with the disclosed embodiments.

FIG. 1 Illustrates a simplified block diagram of an apparatus 100 for combining a plurality of laser beams 112, 114 and 116 in a single dual core optical fiber 108, in accordance with the disclosed embodiments. The laser beams 112, 114 and 116 from a plurality of pump diodes 102, 104 and 106 respectively are launched into a front-end of the single dual core optical fiber 108. A seed beam 122 generated by a seed beam generator 120 is launched into a back end of the optical fiber 108. The seed beam 122 acts to lower a threshold for SBS in the optical fiber 108, thus invoking the nonlinearity. Provided the various pump laser beams 112, 114 and 116 are close in frequency and seed/pump modes overlap, each acts to amplify the seed beam 122 through the nonlinear SBS process, providing an output signal 124 which is brighter than the combined pump beams 152.

Figure 2:
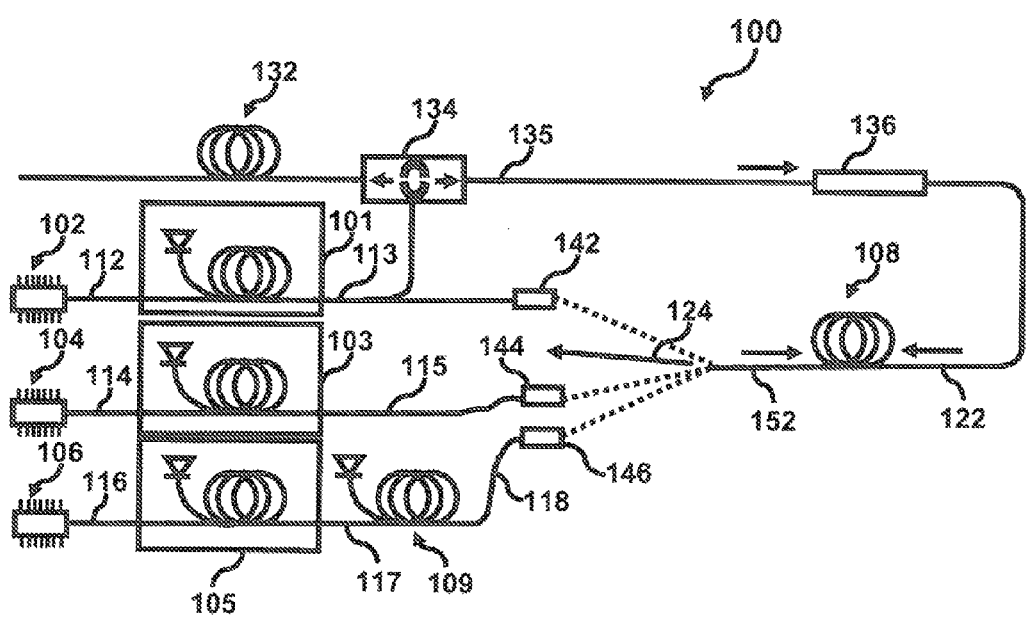
FIG. 2 illustrates a schematic diagram of the apparatus depicted in FIG. 1, in accordance with the disclosed embodiments.

Referring to FIG. 2 a schematic diagram of the apparatus 100 depicted in FIG. 1 is disclosed. The laser beams 112, 114 and 116 from various pump diodes 102, 104 and 106 are amplified by utilizing a plurality of Ytterbium (Yb) fiber amplifiers 101, 103 and 105 respectively. The laser beam 113 from the Ytterbium (Yb) fiber amplifier 101 is trapped and launched into a core of a standard single-mode fiber 132 via an optical circulator 134 to purposely invoke SBS and generate a backward propagating Stokes signal 135. The backward propagating Stokes signal 135 is send to back end of the dual core optical fiber 108 as the seed beam 122 through a modulator 136. The laser beam 117 is further amplified by utilizing an additional fiber amplifier 109. A plurality of mirrors 142, 144 and 146 are utilized to converge the laser beams 113, 115 and 118 as laser beams 152 into the front end of the dual core optical fiber 108 and used to amplify the seed beam 122. The amplified SBS output signal 124 is also show in FIG. 2.

Figure 3:
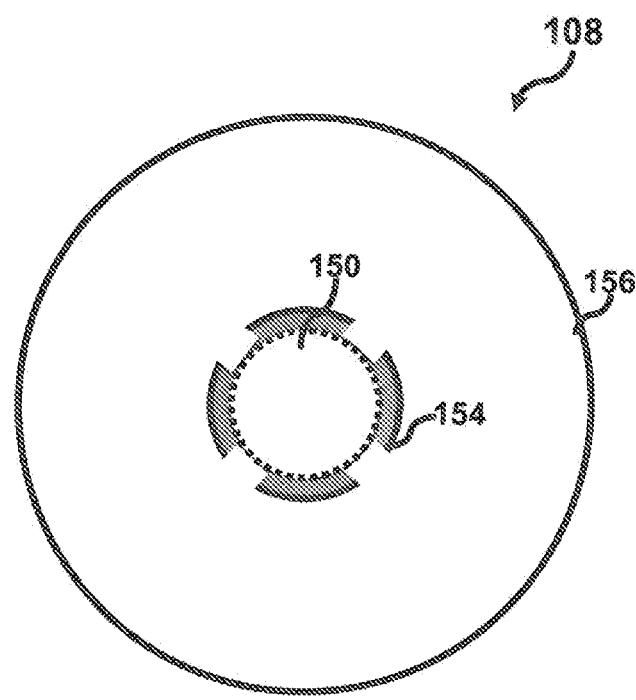
FIG. 3 illustrates a cross sectional view of the single dual core optical fiber, in accordance with the disclosed embodiments.

FIG. 3 illustrates a cross sectional view of the dual core optical fiber 108, in accordance with the disclosed embodiments. The optical fiber 108 has an inner core 150, an outer core 154 and a cladding 156. The laser beams 152 depicted in FIG. 2 are launched into the front end of the outer core 154, also called pedestal of the optical fiber 108 whereas the seed beam 122 depicted in FIG. 2 is launched into the back end of the inner core 150 of the optical fiber 108.

The critical aspect of the optical fiber 108 is the pedestal 154 with the high Numerical Aperture (NA) and core diameter only slightly larger than the SBS seed guiding inner core 150. This large NA is determined by the composition of the optical fiber 108 and the index mismatch between the pedestal 154 and the cladding 156, allowing efficient pump coupling. The seed beam 122 propagates in the inner-core 150 of the fiber 108, which has a low NA for high brightness output. Because of the seeding, SBS is invoked in the core of the optical fiber 108 only. The optical fiber 108 significantly improves the overlap factor, while still allowing for excellent pump coupling.

Figure 4:
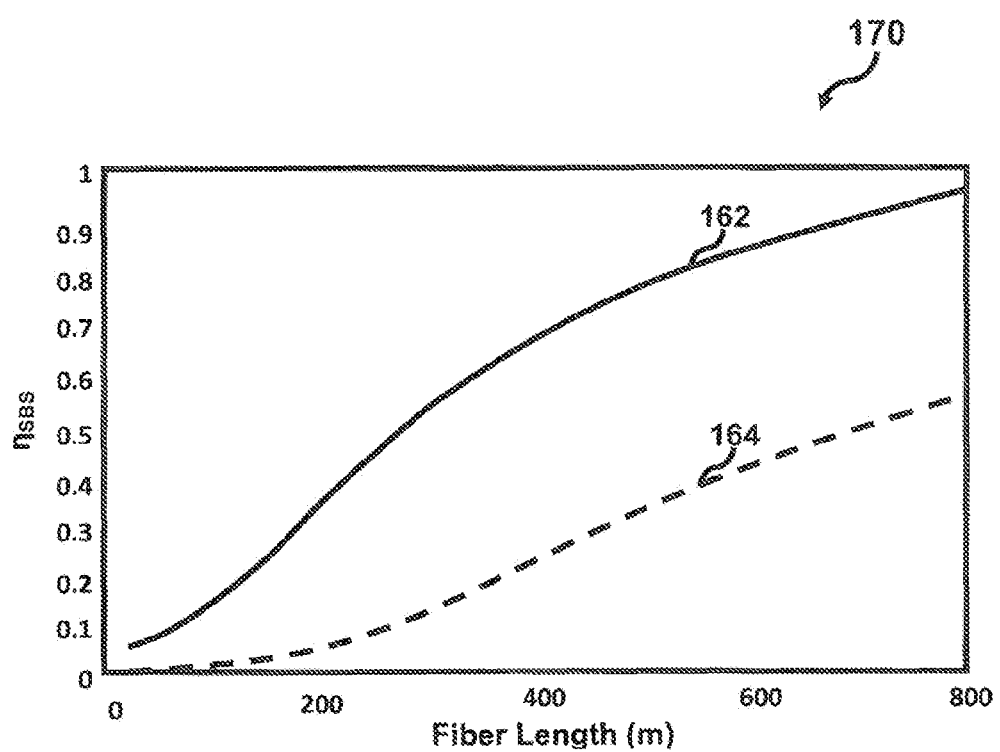
FIG. 4 illustrates a graph showing the variation of a modeled SBS amplification efficiency vs. fiber length in a 25/30 dual core optical fiber depicted in FIG. 3 with an outer core numerical aperture of 0.3 and 9 W of pump, comparing 25 mW and 250 mW of seed power.

FIG. 4 illustrates a graph 170 showing the variation of a modeled SBS amplification efficiency ($\eta_{SBS}$) and fiber length in the optical fiber 108 depicted in FIG. 3, comparing 25 mW 164 and 258 mW 162 of seed power. The outer core 154 of fiber 108 depicted in FIG. 3 which caries pump laser beams has a numerical aperture of 0.3, 9 W of pump and 30 µm diameter. The inner core 150 which carries the seed beam has a numerical aperture of 0.06 and 25 µm diameter.

Note that the dual core SBS fiber design mitigates the high SBS threshold by improving the pump-beam/Stokes beam overlap compared to conventional efforts in a single core GRIN fiber. The seeded SBS process substantially reduces the SBS threshold responsible for beam combination. By seeding the process, the SBS mechanism can be utilized as amplifier for the input beam, deriving several advantages relative to unseeded SBS beam combination. The seeded SBS process increases combination efficiency, fiber lengths can be kept short, prevents competition from efficiency-robbing competitive non-linear processes. Also the amplifiers can be "staged" using conventional components (the required fiber lengths become shorter as power levels increase) and the temporal output amplified beam is controlled by the input. The optical fiber provides excellent spatial overlap of the pump-induced acoustic Brillouin waves and the seed light enable very high (>90%) intrinsic extraction efficiency compared to an unseeded SBS process.

Figure 5:
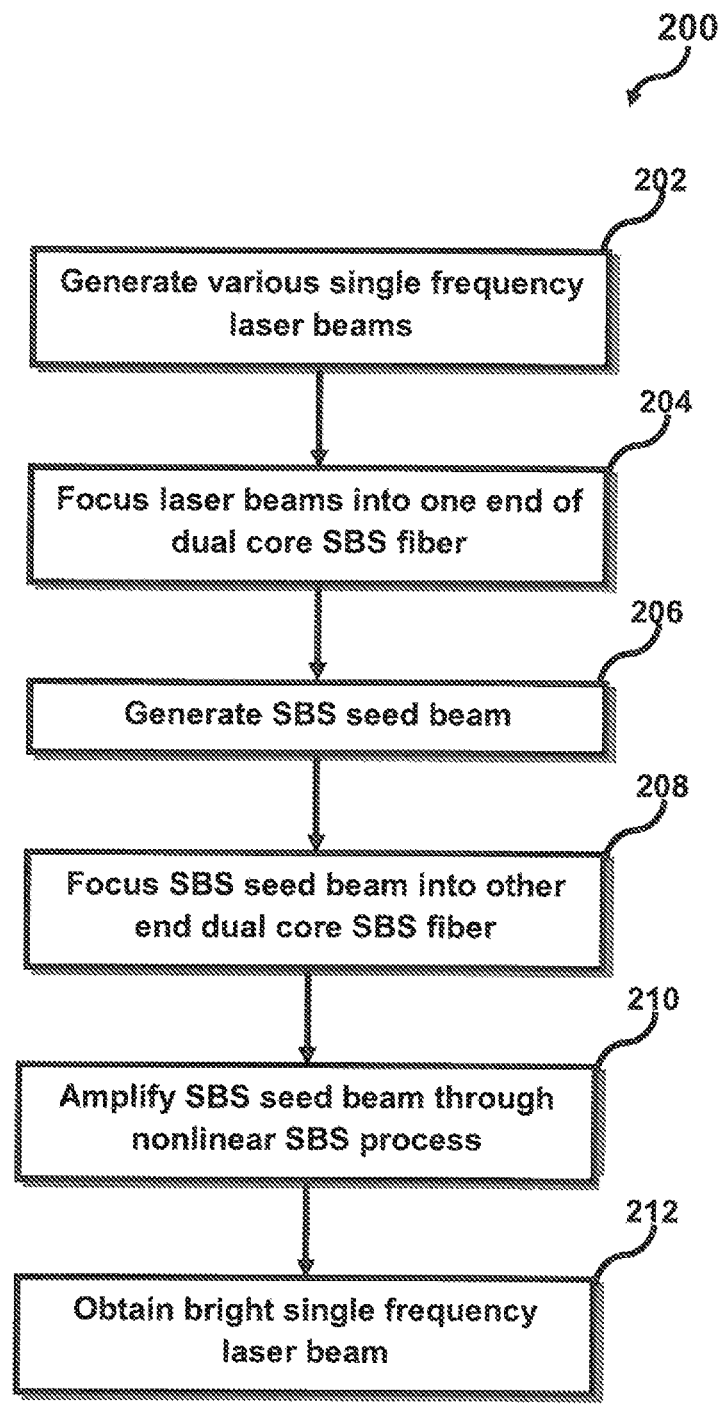
FIG. 5 illustrates a flow chart showing a method of combining a plurality of laser beams in the single dual core optical fiber, in accordance with the disclosed embodiments.

Referring to FIG. 5 a flow chart 200 showing a method of combining plurality of laser beams in single dual core optical fiber is disclosed. As said at block 202 multiple single frequency pump beams are generated. The laser beams are then launched into the front end of the dual core optical fiber as illustrated at block 204. As illustrated at block 206 the seed beam is generated either by trapping a laser beam from the laser beams generated as said at block 202 or by utilizing a separate semiconductor laser. The seed beam is then launched into the back end of the dual core optical fiber as illustrated at block 208. The outer core of the fiber carries pump laser beams and the inner core of the fiber carries seed beams. The dual core fiber amplifies the seed beam through non linear process to obtain a bright single frequency laser beam as said at block 210 and 212.

Note that trapping a laser beam for seed signal is one way of generating the seed beam. A separate semiconductor laser may also be utilized directly as the SBS seed source, making it straightforward to modulate the system. Seeding SBS according to the present invention lowers the threshold. In addition, improving the signal/pump overlap area greatly improves conversion efficiency.

SBS is an effect which is typically unwanted and suppressed in fiber laser systems, as it reduces efficiencies, in this beam combination technique, the use of seeded SBS to incoherently combine multiple pump users, taking advantage of the frequency shift the nonlinear effects imparts on the pump signals. By injecting a counter-propagating, appropriately-frequency shifted seed beam relative to the input beams to be combined, the dynamics of the SBS process can be driven and controlled by the seed beam to create a single, near diffraction-limited beam with, greater than 80% efficiency; effectively, the SBS process is used to amplify the input seed beam. This efficient conversion of multiple low-brightness diode sources is similar to the conversion of pump light in an Yb-fiber laser, but with an inherently higher Stokes efficiency (e.g. 976 nm/1080 nm=90% in Yb compared to 99.996% in an SBS amplifier due to the mere 16 GHz Stokes shift of the SBS process). Our novel dual core passive fiber geometry ensures high efficiency in can demonstrate very high efficiency (approaching 90%) in a simple scalable architecture.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method of combining a plurality of pump laser beams comprising:
    generating said plurality of pump laser beams by utilizing a plurality of pump diodes;
    launching said plurality of pump laser beams into one end of an optical fiber comprising a dual core Stimulated Brillouin Scattering combing optical fiber;
    generating a seed beam by utilizing a seed generator;
    launching said seed beam into another end of said optical fiber; and
    amplifying said seed beam using a nonlinear Stimulated Brillouin Scattering process and obtaining an output signal.

2. The method of claim 1 wherein said seed beam is amplified through a nonlinear SBS process in said optical fiber.

3. The method of claim 1 wherein said output signal is brighter than said combined plurality of laser beams.

4. The method of claim 1 wherein said seed beam acts to lower a threshold for SBS in said optical fiber.

5. The method of claim 1 wherein said seed beam is launched into an inner core of said optical fiber.

6. The method of claim wherein said plurality of laser beams is launched into an outer core of said optical fiber.

7. The method of claim 1 wherein said seed generator comprises trapping at least one laser beam from a plurality of laser beams by utilizing a circulator.

8. The method of claim 1 wherein said seed generator comprises a semiconductor laser.

9. The method of claim 1 wherein critical aspect of said inner core of said optical fiber is greater than critical aspect of said outer core of said optical fiber.

10. A method of combining a plurality of pump laser beams comprising:
    generating said plurality of pump laser beams by utilizing a plurality of pump diodes;
    launching said plurality of pump laser beams into one end of an optical fiber comprising a dual core Stimulated Brillouin Scattering combing optical fiber;
    generating a seed beam by utilizing a seed generator;
    launching said seed beam into another end of said optical fiber; and
    amplifying said seed beam using a nonlinear Stimulated Brillouin Scattering process and obtaining an output signal; and
    said seed beam is amplified through the nonlinear Stimulated Brillouin Scattering process in said optical fiber; and
    said output signal is brighter than said combined plurality of laser beams.

11. An apparatus for combining a plurality of pump laser beams comprising:
    a plurality of pump diodes for generating said plurality of pump laser beams;
    a seed generator for generating a seed beam; and
    an optical fiber acting as a nonlinear optical amplifier for combining said plurality of laser beams and said seed beam by utilizing a nonlinear Stimulated Brillouin Scattering process, wherein said optical fiber amplifies said seed beam through the nonlinear Stimulated Brillouin Scattering process and provides an output signal.

12. The apparatus of claim 11 wherein said plurality of pump beams are launched into one end of said optical fiber and said seed beam is launched into other end of said optical fiber.

13. The apparatus of claim 11 wherein said optical fiber comprises a dual core SBS combining optical fiber.

14. The apparatus of claim 11 wherein said output signal is brighter than combined said plurality of laser beams.

15. The apparatus of claim 11 wherein said seed beam acts to lower a threshold for SBS in said optical fiber.

16. The apparatus of claim 11 wherein said seed beam launched into an inner core of said optical fiber.

17. The apparatus of claim 11 wherein said plurality of laser beams is launched into an outer core of said optical fiber.

18. The apparatus of claim 11 wherein said seed generator comprises trapping at least one laser beam from a plurality of laser beams by utilizing a circulator.

19. The apparatus of claim 11 wherein said seed generator comprises a semiconductor laser.

20. The apparatus of claim 11 wherein critical aspect of said inner core of said optical fiber is greater than critical aspect of said outer core of said optical fiber.

* * * * *